Oct. 22, 1957

M. R. HUBBARD 2,810,833

TUNER

Filed Jan. 25, 1955

INVENTOR.
MERLE R. HUBBARD
BY Marvin Moody
ATTORNEY

United States Patent Office 2,810,833

Patented Oct. 22, 1957

2,810,833

TUNER

Merle R. Hubbard, Cedar Rapids, Iowa, assignor to Collins Radio Company, Cedar Rapids, Iowa, a corporation of Iowa Application January 25, 1955, Serial No. 483,925

4 Claims. (Cl. 250—40)

This invention relates to tuning devices and more particularly to such devices for tuning radio and related equipment in the very high frequency range.

Priorly, tuning devices have generally been tuned by a system which varied the capacitance of variable condensers or by a system which varied the inductance of variable inductors. These systems are useful in many frequency ranges. However, these systems have many disadvantages when used in the very high frequency range. The primary disadvantage of these systems in the very high frequency range is that a variation in the value of one impedance requires a corresponding variation in the value of the other impedance, these impedances being capactive and inductive.

This invention comprises a tuning mechanism which is especially useful in the very high frequency range and which accurately varies both the inductive and capacitive impedance of the tuning mechanism to provide a straight-line tuning curve.

It is a feature of this invention that a straight-line tuning curve is obtained with varied capacitive and inductive elements. It is a further feature of this invention that a more constant value of the inductive to capacitive ratio is maintained over the entire frequency range of the tuned circuit. It is a still further feature of this invention that only a very small series impedance is necessary to connect the tuned circuit to the vacuum tube with which it is associated.

It is an object of this invention to provide a precision tuned circuit usable in the very high frequency range which is economical and compact. It is a further object of this invention to provide a tuned circuit which has low inductance and low impedance ground connections.

It is a still further object of this invention to provide a tuned circuit of the parallel resonant type, the resonant frequency of which is variable over a wide frequency range. These and other objects of this invention will become apparent when the following description is read in conjunction with the accompanying drawings, in which.

Figure 1:
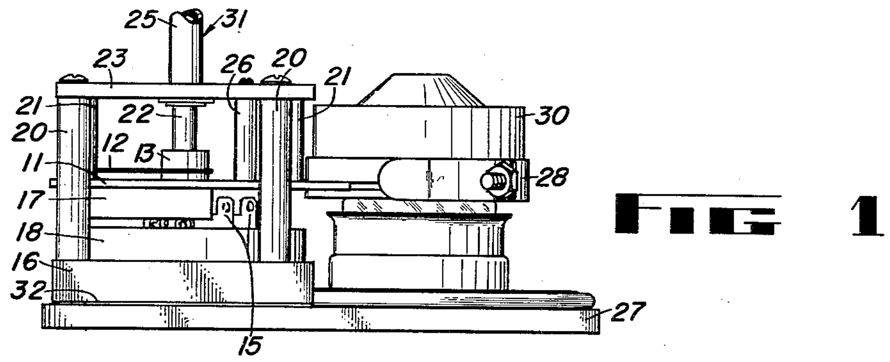
Figure 1 is a side view of one embodiment of this invention connected to a vacuum tube.

This invention is operated by rotating capacitive and inductive elements to vary the capacitive and inductive impedance of the resonant circuit. In Figure 1, inductance ring 11 formed of a low electrical resistance metal such as brass, copper, or silver, is connected to a vacuum tube 30 and held in position by clamp 28. On one side, and as illustrated in Figure 1 the under side of this inductance ring 11, is placed a metallic strip 17. This inductance ring and this strip are electrically and physically connected so that they become integral and will be hereafter referred to as inductance ring 11. Inductance ring 11 is fastened to a dielectric plate 23 which may be composed of any suitable insulating material. This inductance ring is connected to the plate 23 by pins 21 and by dielectric stand-off 26. This inductance ring 11 is located between the dielectric plate 23 and a base plate 16 which is composed of metal or some low electrical resistance substance. The plate 16 is attached to a ground plate 27 but separated therefrom by a thin dielectric sheet 32 of any suitable dielectric material. This connection forms a low inductance, high capacity ground by-pass condenser between plate 16 and the ground plate 27. This base plate 16 has a ring 18 attached thereto. This ring is an integral part of base plate 16 similar to the integral metal of inductance ring 11. The spacing and dimensions of the inductance ring 11 are dependent to a great extent upon the dimensions of the tube to which inductance ring 11 may be attached.

The shaft assembly 31 is a composite of a dielectric portion 22, a metal sleeve 25, and a low resistance metal shaft 13. This shaft assembly is supported on bearings 24 and 29. There is also a cylindrical washer 19 of low electrical resistance surrounding the shaft 13 to electrically connect the base plate 16 to the shaft 13.

To the shaft element 13 are attached a pair of rotor plates 12 and an arm 14. The rotor plates 12 may be slotted to permit easier adjustment of the capacity between the plate 16 and the inductance ring 11. The arm 14 has at its extremity contact fingers 15. These contact fingers are so constructed that they press firmly against elements 17 and 18. This electrically connects inductance ring 11 to base plate 16 through the low resistance contacts 15 and also comprises a low inductance shorting bar between inductance ring 11 and base plate 16. The spacing between the ring 17 of inductance 11 and the ring 18 of base plate 16 should be as small as possible to minimize the length of contact fingers 15, thereby minimizing the inductance of the ratio of contact fingers 15 to the total inductance in the circuit.

The various elements are held together by plastic or ceramic stands-offs which, in this specific illustrative embodiment, are shown as elements 20.

Inasmuch as this invention has been mechanically described, a complete description must necessarily contain a description of the electrical functioning of this invention. The contact fingers 15, which also constitute an inductance shorting bar, are so located that when the highest resonant frequency is tuned the greatest amount of the inductance ring 11 is connected to base plate 16. There is then a very small inductance value between base plate 16 and the tube 30. Now, as the contact fingers 15, also acting as a shorting bar, move farther away from the tube 30, the inductance of the inductance ring 11 is increased by the amount of the increase in the effective distance of ring 11 between tube 30 and base plate 16. The movement of the contact fingers 15 is accomplished through a rotation of shaft assembly 31. The rotation of shaft assembly 31 also rotates the rotor plates 12 so that a greater area of the inductance ring 11 comes between the plates 12, thereby increasing the capacity between base plate 16 and inductance ring 11.

Figure 2:
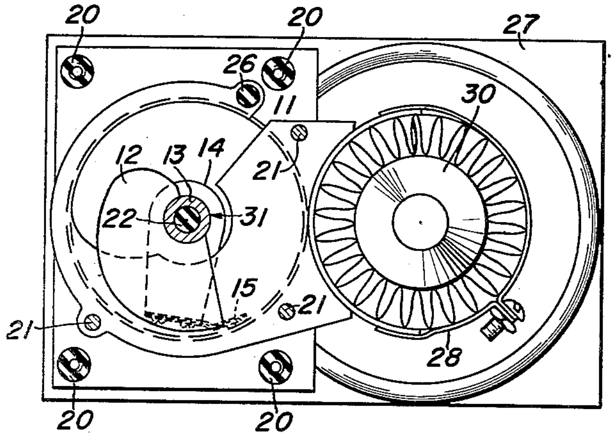
Figure 2 is a top view of one embodiment of this invention connected to a vacuum tube.
Figure 3:
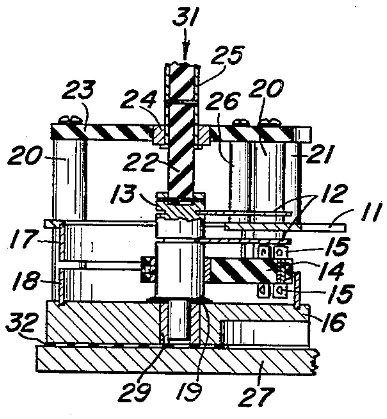
Figure 3 is a sectional view in elevation of one embodiment of this invention.

Thus, as the shaft is rotated so that the contact fingers 15 are moved in a clockwise direction from their position as shown in Figure 2, the inductance between base plate 16 and tube 30 increases and the capacity between base plate 16 and tube 30 also increases. Thus, as illustrated in Figure 2, the invention is tuned to give the highest resonant frequency. Now the rotation clockwise in Figure 2 of the contact fingers 15 and the rotor plates 12 increases both the inductance and the capacity of the tuned circuit and lowers the resonant frequency.

By controlling the shape of the rotor blades 12 and the inductance ring 11, it is possible to control the tuning curve of this invention with changes in rotation of the shaft 31. In one specific illustrative embodiment, a resonant frequency is varied between 220 and 400 megacycles at a rate of one megacycle for each degree of rotation of the shaft. This characteristic permits the use of mechanically driven and controlled rotational energy in conjunction with this invention.

One further characteristic of this invention is the low inductance high capacity ground bypass condenser between plate 16 and ground. The action of this bypass condenser is to permit the passage of radio frequency currents generated by tube 30 and this invention to ground. The desirable effect is then that little series inductance is required to be placed between the inductive capacitive tuning elements of the invention and the ground return path. Thus the resonant circuit is more directly connected to tube 30 and maximum efficiency results.

Although this invention has been described with respect to a specific embodiment thereof, it is not to be so limited as changes and modifications may be made therein which are within the full intended scope of the invention, as defined by the appended claims.

What is claimed is:

1. A radio-frequency tuning device comprising an inductance ring including a metal plate having a circular strip attached thereto, a base plate including a circular strip attached thereto, said plates and said strips being juxtaposed and thereby forming a capacitive circuit between said plates, a rotatable shaft positioned within said strips and connecting said plates, capacitor plates attached to said shaft which interleave said inductance ring when rotated, thereby varying the capacitance between said base plate and said inductance ring, a low-resistance shorting bar attached to said shaft and connecting the strips on said inductance ring and said base plate whereby the inductance is varied, a grounding plate connected to said base plate but separated therefrom by a dielectric sheet, thereby forming a capacity between said base plate and ground, and means for connecting said inductance ring to the load, thereby connecting the tuned resonant frequency to said load.

2. A radio-frequency tuning device comprising a first metallic plate having a circular metallic strip attached thereto, said first metallic plate being connected to a load, a second metallic plate having a circular metallic strip attached thereto, said strips being positioned as closely as the load requirements will permit, a rotatable shaft positioned in the center of said circular strips and connecting said plates, a third plate comprising a dielectric and connected to said second plate by dielectric stand-offs, said dielectric plate being connected to said first metallic plate by electrical conducting means, plates attached to said shaft which are positioned on said shaft one above and one below the level of said first metallic plate, a shorting bar connected to said shaft which connects said first metallic strip to said second metallic strip, and a grounding plate connected to said second metallic plate but separated therefrom by a dielectric sheet creating a resonant circuit at various frequencies determined by the rotation of said shaft.

3. A radio-frequency tuning device comprising a first plate including a circular strip attached thereto, said first plate being connected to a load, a second plate having a circular strip attached thereto, said plates and said strips being positioned as close to each other as the load requirements permit, said plates and said strips being of low-resistance material, a rotatable shaft positioned in the center of said circular strips and connecting said plates, a third plate of dielectric material connected to said second plate by dielectric stand-offs, said dielectric plate being connected to said first plate by electrically conducting means, plates attached to said shaft and positioned on said shaft so that when said shaft is rotated said plates pass one above and one below said first plate, a shorting bar of low-resistance material connected to said shaft, said shorting bar electrically connecting said first strip to said second strip and a grounding plate of low-resistance material connected to said second plate but separated therefrom by a dielectric sheet making a variable resonant circuit.

4. A radio-frequency tuning device including a plurality of metallic sheets, some of said sheets having circular metallic strips attached at right angles thereto, a dielectric sheet, dielectric means connecting said dielectric sheet to certain of said sheets and electrically conducting means connecting said dielectric sheet with certain other of said sheets, a rotatable shaft penetrating said sheets, means attached to said shaft for electrically connecting said strips and means attached to said shaft for enclosing a certain one of said metallic sheets whereby a variable resonant frequency is generated as said shaft is rotated.

References Cited in the file of this patent

UNITED STATES PATENTS 2,511,586 Hubbard ---------------- June 13, 1950